(12) United States Patent
Fujii

(10) Patent No.: US 6,989,583 B2
(45) Date of Patent: Jan. 24, 2006

(54) SEMICONDUCTOR DEVICE

(75) Inventor: Shinji Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/782,763

(22) Filed: Feb. 23, 2004

(65) Prior Publication Data
US 2004/0222531 A1    Nov. 11, 2004

(30) Foreign Application Priority Data
Mar. 26, 2003   (JP)   ............... 2003-085183

(51) Int. Cl.
*H01L 29/40*   (2006.01)
(52) U.S. Cl. ..................... 257/621; 257/762
(58) Field of Classification Search ........... 257/758, 257/762
See application file for complete search history.

(56) References Cited

U.S. PATENT DOCUMENTS

| 6,670,714 B1 | 12/2003 | Miyamoto et al. |
| 6,693,049 B2 * | 2/2004 | Iguchi et al. |
| 6,846,227 B2 * | 1/2005 | Sato et al. .................. 451/288 |

* cited by examiner

*Primary Examiner*—Fetsum Abraham
(74) *Attorney, Agent, or Firm*—Oblon, Spivak, McClelland, Maier & Neustadt, P.C.

(57) ABSTRACT

A semiconductor device containing a multi-layered wiring structure formed on a semiconductor substrate, the structure including at least two wiring layers formed in an interlayer insulation layer, and each of the wiring layers including a metal wiring made of one of Cu and a Cu alloy, wherein the multi-layered wiring structure comprises a lower wiring layer formed under the interlayer insulation layer, a via buried in the interlayer insulation layer to connect an upper wiring layer and the lower wiring layer, and a dummy via buried in the interlayer insulation layer, the dummy via being not connected to the upper wiring layer.

20 Claims, 6 Drawing Sheets

Heat treatment

SEMICONDUCTOR DEVICE

CROSS-REFERENCE TO RELATED APPLICATIONS

This application is based upon and claims the benefit of priority from prior Japanese Patent Application No. 2003-085183, filed Mar. 26, 2003, the entire contents of which are incorporated herein by reference.

BACKGROUND OF THE INVENTION

1. Field of the Invention

The present invention relates to a semiconductor device of a multi-layered wiring structure, more specifically to a semiconductor device having a wiring designed by a design rule of a dummy pattern, the dummy pattern being formed with respect to a damaged region of the wiring by a via hole etching process, when the wiring is made of a material such as Cu or a Cu alloy, wherein the present invention is applied, for example, to a CMOSLSI (complementary MOS large-scale integration) circuit.

2. Description of the Related Art

In LSIs having a multi-layered wiring structure, Cu or its alloy has come to be used as a wiring material in place of conventionally-used Al, because the use of the Cu or its alloy helps decrease the resistance of wirings and vias and improves the reliability of them. In the case where the wirings and vias are made of Cu, however, the vias are likely to have open defects due to voids generated in the Cu wirings.

Where the wirings and vias made of Cu or a Cu alloy have a specific pattern, the voids are generated in the manufacturing step and the stress migration may be observed in a high-temperature test which is carried out at 225° C. and continued for 300 hours, for example. These will cause contact defects (disconnection or open defects), thereby degrading the performance of the manufactured semiconductor device.

The mechanism of the generation of such contact defects has not been made clear. A description will therefore be given of the phenomenon along with conceivable causes.

FIGS. 7A and 7B are plan views and schematically illustrate examples of patterns in which two wiring layers each having a wiring made of Cu or a Cu alloy and vias used for interlayer connection between the two wiring layers are arranged according to the prior art. The two wiring layers are part of a CMOSLSI of multi-layered wiring structure. In FIGS. 7A and 7B, reference numeral 71 denotes a lower wiring (Cu wiring), reference numeral 72 denotes an upper wiring (a Cu wiring), and reference numeral 73 denotes a via for interlayer connection between the cu wirings 71 and 72.

FIG. 7A illustrates a structure wherein the wide lower wiring 71 (whose width W is greater than a predetermined value) is connected to the upper wiring 72 through the single via 73. If a product having this structure undergoes stress migration in a high-temperature test, the via 73 has a contact defect (an open or disconnection defect).

FIG. 7B illustrates a structure wherein the wide lower wiring 71 (whose width W is greater than a predetermined value) is joined to a narrow lower wiring 71a (whose width Wn is not more than a predetermined value) in the same lower wiring layer, and wherein the upper wiring layer 72 is connected to the narrow lower wiring layer 71a through the single via 73. If a product having this structure undergoes stress migration in a high-temperature test, the via 73 has the similar contact defect.

FIGS. 8A and 8B are sectional views schematically illustrating how the Cu crystals of a narrow lower Cu wiring that is not joined to a wide lower Cu wiring (unlike that 71a shown in FIG. 7B) will be changed before and after heat treatment. In the case shown in FIGS. 8A and 8B, no void is generated even after the heat treatment FIGS. 9A and 9B are sectional views schematically illustrating how the Cu crystals of the wide lower Cu wiring 71 shown in FIGS. 7A and 7B will be changed before and after heat treatment. In the case shown in FIGS. 9A and 9B, a void 90 is generated in the wiring 71 after the heat treatment.

FIG. 10 shows an example of a contact defect (disconnection or open defect) of a via 73 connected to the lower wiring (Cu wiring) 71 (or 71a) shown in FIGS. 7A and 7B. In FIG. 10, reference numerals 74 and 75 denote barrier metal films.

In the case where a via hole (for the via 73) is formed in an interlayer insulation film (not shown) on the lower wiring 71 (71a) by reactive ion etching (RIE) and is then subjected to heat treatment, the exposed surface region of the wiring 71 (71a) at the bottom of the via hole is damaged or stressed due to the etching or heat treatment after the formation of the via hole. When Cu crystal grains are grown in the subsequent annealing process, contact defects (open defects) are caused in the wide lower wiring 71 shown in FIG. 7A and in the narrow lower wiring 71a shown in FIG. 7B joined to the wide lower wiring 71, because the bottoms (damaged regions 100) of the via holes in such wiring undergo damage or stress and voids 90 are concentratedly moved.

The conventional semiconductor device described above has a multi-layered wiring structure wherein the wirings and vias formed in the wiring layers are made of Cu or Cu alloy. In the case where a via formed in an upper wiring layer is connected to a wide wiring formed in the lower wiring layer, the connection between the via and lower wide wiring may suffer a contact defect (degraded reliability) arising from the heat treatment of the manufacturing process.

In an effort to solve the problems described above, the Assignee of the present application has proposed a semiconductor device in Japanese Patent Application No. 2002-212908. The semiconductor device in this patent application comprises multi-layered wirings made of Cu or a Cu alloy. When a wide lower wiring formed in a lower wiring layer is connected to an upper wiring through a via formed in the upper wiring layer, predetermined restrictions are defined on the design rules of the wirings and the vias in such a way as to increase the reliability of the multi-layered wirings.

In the proposed semiconductor device described above, the multi-layered wiring structure formed on the semiconductor substrate comprises a plurality of wiring layers each including a wiring made of Cu or an Cu alloy, and a via formed through a wiring layer. In order to prevent a via (which is used for connecting a lower wiring layer to an upper wiring layer) from having a contact defect, the following design rules are adopted:

(1) the number of contacts or vias connecting to a lower wiring from an upper wiring is determined in accordance with the width of the lower wiring or the volume of this lower wiring.

(2) In the case where a wide lower wiring is joined to a narrow lower wiring in the same wiring layer, the voids that are generated on wide lower wiring are likely moved to narrow lower wiring joined to wide lower wiring. With this in mind, the number of contacts or vias leading to the lower wiring is determined in accordance with the wiring width or volume of the narrow lower wiring.

According to one of these design rules, two or more interlayer-connection vias are formed if an open defect is likely at a single via. The region where the two or more interlayer-connection vias are formed is a void effective diffusion region. In this region, voids in the Cu wiring are generated concentratedly and a contact defect is likely to occur in the via bottom damaged or stressed by the etching performed when a via hole is formed and by the heat treatment performed after the via hole is formed.

By forming two or more vias as above-mentioned, voids generated in the lower wiring at the time of heat treatment, are distributed to the bottom regions of the vias. The via where the more voids are concentrated serves as a redundancy via, so that the contact characteristics of the other via or vias do not deteriorate, and the reliability of the semiconductor device is not adversely affected.

Even if two or more interlayer-connection vias are formed, they do not function as such. That is, it is necessary to presume that an open defect is caused in one of the vias. In addition to this design restriction, the number of vias to be formed has to be determined, depending upon whether or not a wide lower wiring is continuous with a narrow lower wiring at the same wiring layer.

BRIEF SUMMARY OF THE INVENTION

A semiconductor device according to one aspect of the present invention containing a multi-layered wiring structure formed on a semiconductor substrate, the structure including at least two wiring layers formed in an interlayer insulation layer, and each of the wiring layers including a metal wiring made of one of Cu and a Cu alloy; wherein the multi-layered wiring structure comprises: a lower wiring layer formed under the interlayer insulation layer; a via buried in the interlayer insulation layer to connect an upper wiring layer and the lower wiring layer; and a dummy via buried in the interlayer insulation layer, the dummy via being not connected to the upper wiring layer.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described in detail with reference to the accompanying drawings.

<First Embodiment>

Figure 1:
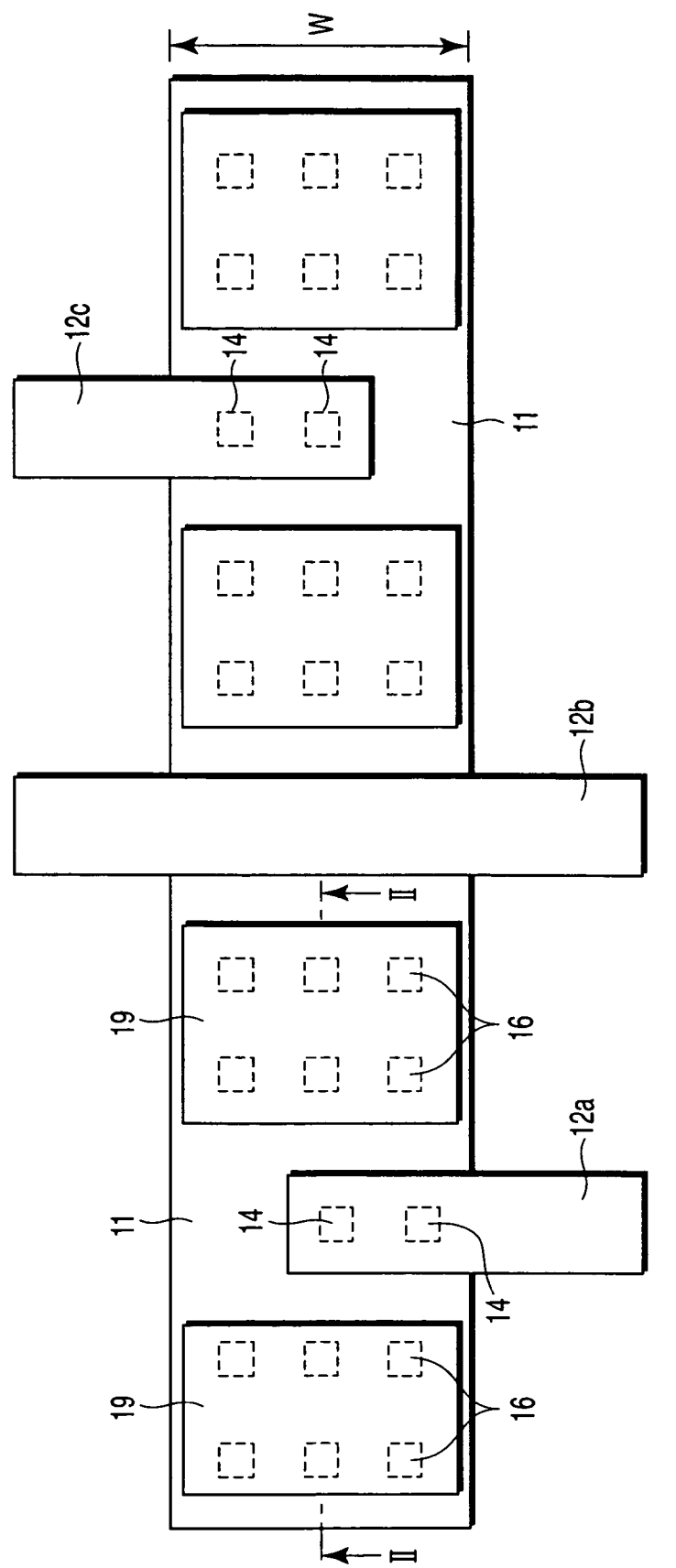
FIG. 1 is a plan view schematically showing wirings at adjacent two different wiring layers, the wiring layers being part of the multi-layered wiring structure of a CMOSLSI according to the first embodiment and the wirings being made of Cu or a Cu alloy.

FIG. 1 is a plan view schematically showing wirings at adjacent two different wiring layers, the wiring layers being part of the multi-layered wiring structure of a CMOSLSI according to the first embodiment and the wirings being made of Cu or a Cu alloy.

Figure 2:
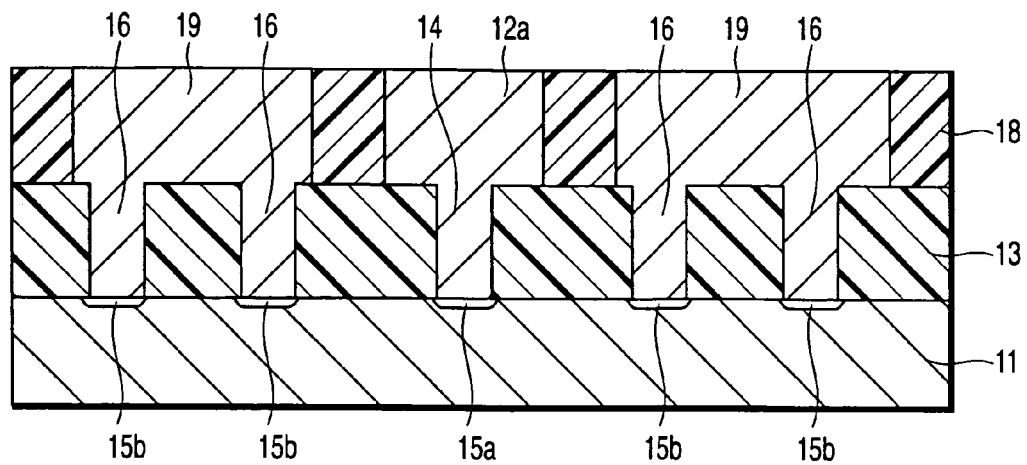
FIG. 2 is a sectional view taken along line II—II of FIG. 1.

FIG. 2 is a sectional view taken along line II—II of FIG. 1.

In FIGS. 1 and 2, reference numeral 11 denotes a lower wiring formed in a lower wiring layer of the adjacent two wiring layers formed on a semiconductor substrate. The lower wiring 11 is buried in a wiring groove formed in an interlayer insulation film (not shown). Reference numerals 12a, 12b, 12c denote upper wirings formed in an upper wiring layer of the adjacent two wiring layers. Some of these upper wirings 12a and 12c are connected to the lower wiring 11 through interlayer connection vias 14. The other upper wiring layer 12b passes across the lower wiring 11. In the present embodiment, the lower wiring 11 is wide and has a width W greater than a predetermined value. The width of each upper wiring layer 12a, 12b or 12c can be arbitrarily determined.

Reference numeral 13 shown in FIG. 2 denotes an interlayer insulation film located between the wide lower wiring 11 formed in the lower wiring layer and the upper wirings 12a–12c formed in the upper wiring layer. The interlayer insulation film 13 is made of a silicon oxide film ($SiO_2$) containing phosphor (or boron) and formed by CVD (chemical vapor deposition).

Reference numeral 14 denotes interlayer connection vias buried in the interlayer insulation film 13. The wide lower wiring 11 and the upper wirings 12a and 12c are connected through an optimal number of vias 14. Two vias 14 are formed in each of the upper wirings 12a and 12c in the case of this embodiment. The interlayer connection vias 14 are provided by: forming interlayer connection via holes in the interlayer insulation film 13 by anisotropic etching (normally, by RIE); subsequently depositing Cu on a barrier metal made of, such as Ta, TaN or TiN; and then flattening the resultant structure by CMP (chemical mechanical polishing) in such a manner that the barrier metal and Cu are left in the interlayer connection via holes.

Of the portions of the lower wiring 11, those portions which are away from the contact portions with the interlayer connection vias 14 are "vacant" portions. In these "vacant" portions or regions, dummy damaged regions 15b that have similar to damaged regions 15a can be selectively formed when the interlayer connection via holes are formed in the interlayer insulation film 13 by RIE. The damaged regions 15a and the dummy damaged regions 15b are formed in the lower wiring 11 at positions that are under the bottoms of the via holes. The dummy damaged regions 15b are formed by forming a dummy via hole in the interlayer insulation film 13 simultaneously when the interlayer connection via holes are formed by RIE.

Dummy vias 16 are buried in the interlayer insulation film 13 in such a manner that they are in contact with the dummy damaged regions 15b. The dummy vias 16 are formed in the same step as the interlayer connection vias 14 and have the same layer structure as them.

An interlayer insulation layer 18 is formed on the film 13 simultaneously with, or independently of, the interlayer insulation film 13 in which the interlayer connection vias 14 and the dummy vias 16 are buried. Wiring grooves are formed in the interlayer insulation film 18, and upper wirings 12a and 12c are buried in the wiring grooves in such a manner that they are joined to the interlayer connection vias 14. Likewise, dummy wiring grooves are formed in the interlayer insulation film 18, and dummy upper wiring patterns 19 are buried in the dummy wiring grooves in such a manner that they are continuous with the dummy vias 16, as shown in FIG. 2.

With the above configuration, the damaged regions 15a and 15b in the portions of the lower wiring 11 under the bottoms of the via holes are damaged or stressed when the interlayer connection via holes and dummy via holes are formed in the interlayer insulation film 13 by RIE. When the Cu crystal grains of the lower wiring 11 are grown in the subsequent annealing process, voids tend to be moved concentratedly to the damaged regions 15a and 15b of the lower wiring 11. Since, however, most of the voids are concentratedly moved to the dummy damaged regions 15b under the bottom of the dummy via holes then, the interlayer connection vias 14, which are buried in the interlayer connection via holes in the subsequent process, are in reliable contact with the lower wiring 11.

As can be seen from the above, circuits can be designed with no need to consider the design restrictions. In other words, it is not necessary to presume that an open defect is caused in one of a plurality of interlayer connection vias (two vias 14, in this embodiment) formed for connecting a wide lower wiring to upper wirings.

<Second Embodiment>

Figure 3:
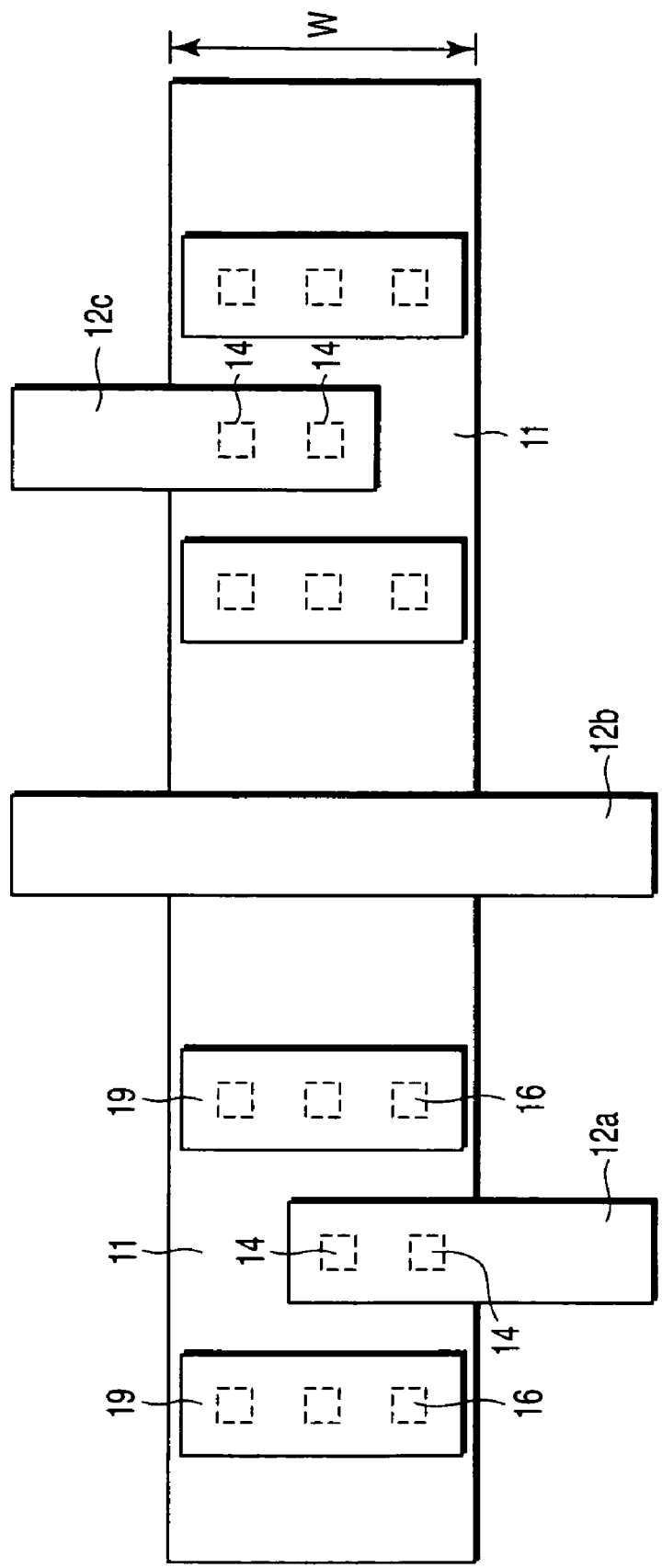
FIG. 3 is a plan view schematically showing wirings at adjacent two different wiring layers, the wiring layers being part of the multi-layered wiring structure of a CMOSLSI according to the second embodiment and the wirings being made of Cu or a Cu alloy.

FIG. 3 is a plan view schematically showing wirings formed in adjacent two different wiring layers, the wiring layers being part of the multi-layered wiring structure of a CMOSLSI according to the second embodiment and the each wiring being made of Cu or a Cu alloy.

The second embodiment shown in FIG. 3 differs from the first embodiment in that the dummy damaged regions (indicated by 15b in FIG. 2) are formed at limited positions. To be more specific, the dummy damaged regions are limited only to positions that are in the vicinity of the contact portion of interlayer connection vias 14 (e.g., two sides of the each interlayer connection via 14); it is not formed in the entire vacant regions that are parts of the lower wiring 11 and that are away from the contact portions with the interlayer connection vias 14. Except for this point, the second embodiment is similar to the first embodiment, and similar or corresponding structural elements are denoted by the same or similar reference numerals as used in the first embodiment. In FIG. 2, the dummy damaged regions 15b are formed at opposite side positions of the contact portion 15a of the interlayer connection via. The opposite side positions of the regions 15b are away from each other by a predetermined minimum distance defined by a design rule.

The advantages of the second embodiment are substantially similar to those of the first embodiment.

<Modification of Second Embodiment>

Figure 4:
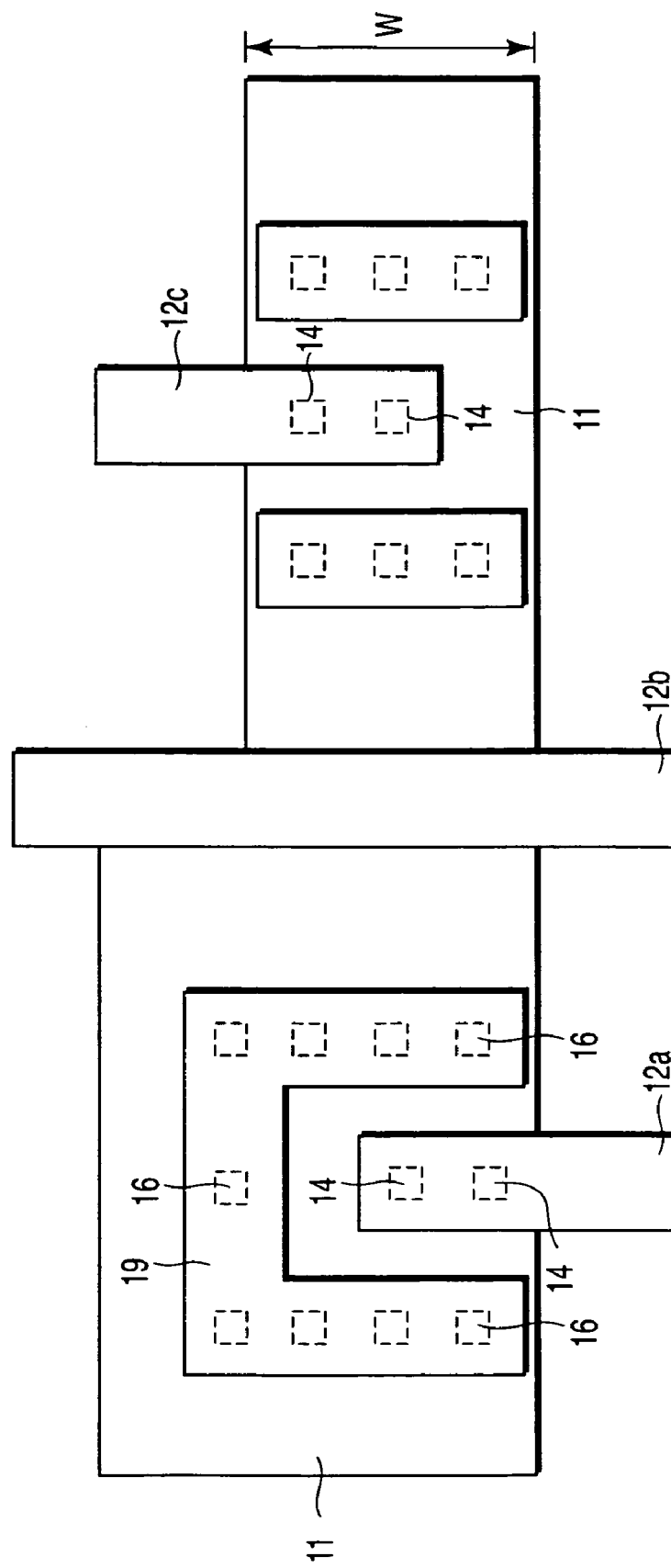
FIG. 4 is a plan view schematically showing a modification of the second embodiment shown in FIG. 3.
Figure 7A:
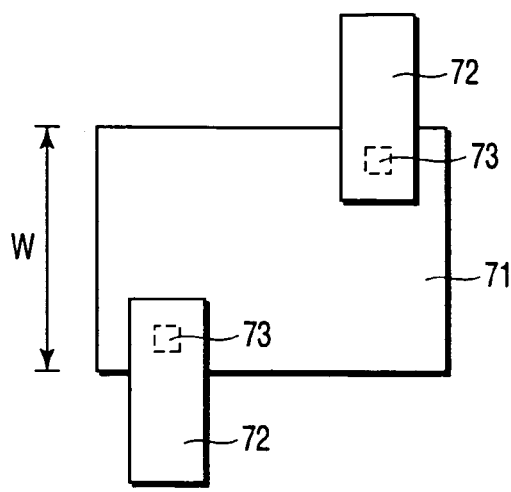
FIGS. 7A and 7B are plan views schematically illustrating two examples of patterns in which wirings made of Cu or a Cu alloy and vias used for interlayer connection are arranged according to the prior art. The adjacent two wiring layers are part of a CMOSLSI of multi-layered wiring structure.
Figure 7B:
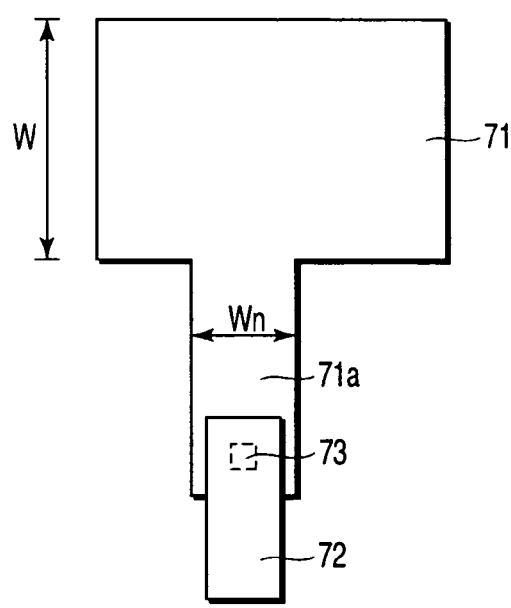
Figure 8A:
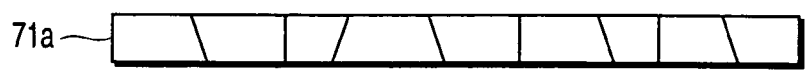
FIGS. 8A and 8B are sectional views schematically illustrating how the Cu crystals of a narrow lower wiring (a Cu wiring) that is not joined to a wide lower wiring (a Cu wiring) will be changed before and after heat treatment.
Figure 8B:
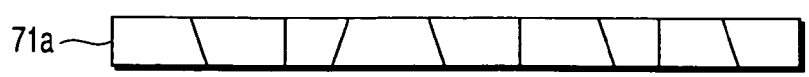
Figure 9A:
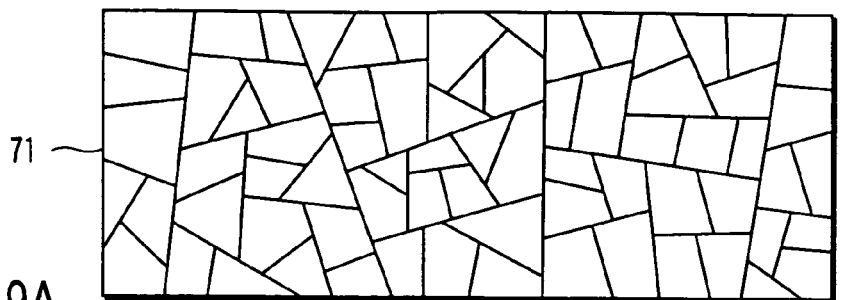
FIGS. 9A and 9B are sectional views schematically illustrating how the Cu crystals of the wide lower wiring 71 shown in FIGS. 7A and 7B will be changed before and after heat treatment.
Figure 9B:
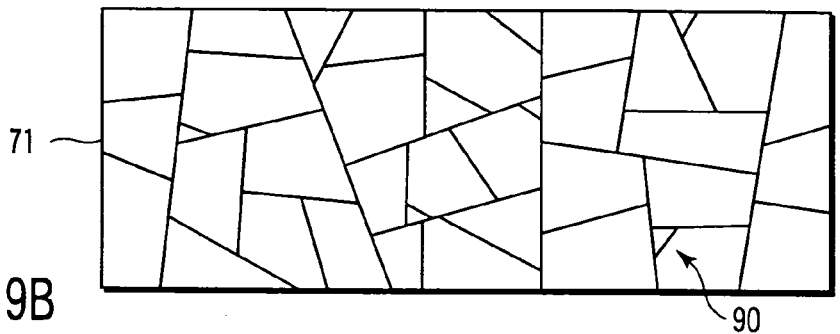
Figure 10:
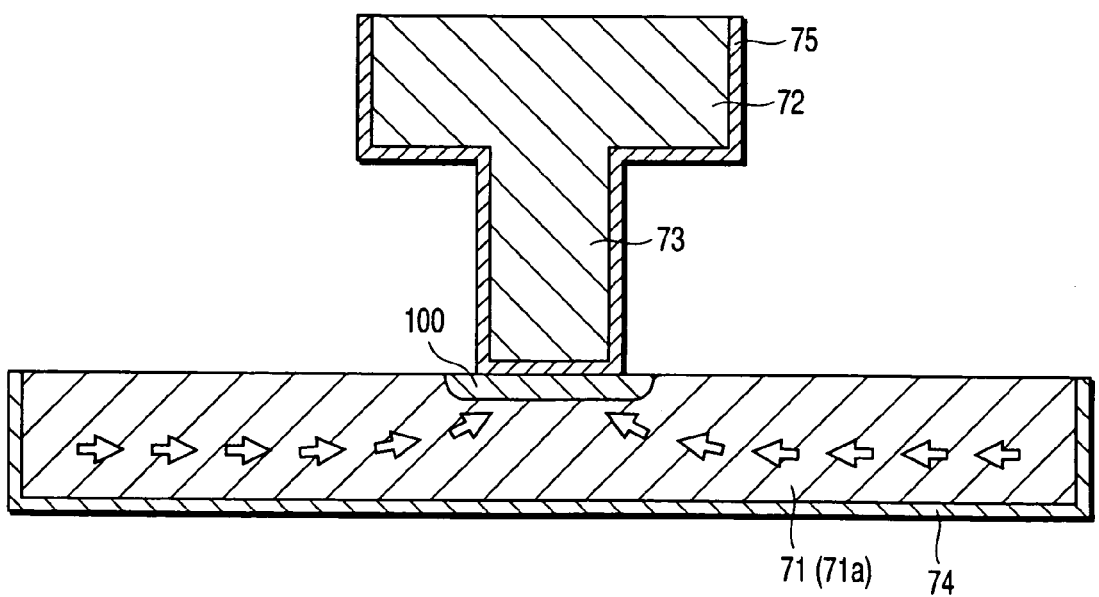
FIG. 10 shows an example of a contact defect (open defect) of a via formed in contact with the lower wiring shown in FIGS. 7A and 7B.

FIG. 4 is a plan view schematically showing a modification of the second embodiment.

The modification shown in FIG. 4 differs from the second embodiment in that a dummy damaged region (indicated by 15b in FIG. 2) is formed in such a manner as to surround the contact portions of the interlayer connection vias 14 of a wide lower wiring 11 (e.g., on three of the four sides defining the contact portions of the interlayer connection vias 14), and in that dummy vias 16 are formed in contact with the dummy damaged regions. Except for this point, the modification is similar to the second embodiment, and similar or corresponding structural elements are denoted by the same reference numerals as used in the second embodiment.

The advantages of the modification are similar to those-of the second embodiment.

<Third Embodiment>

Figure 5:
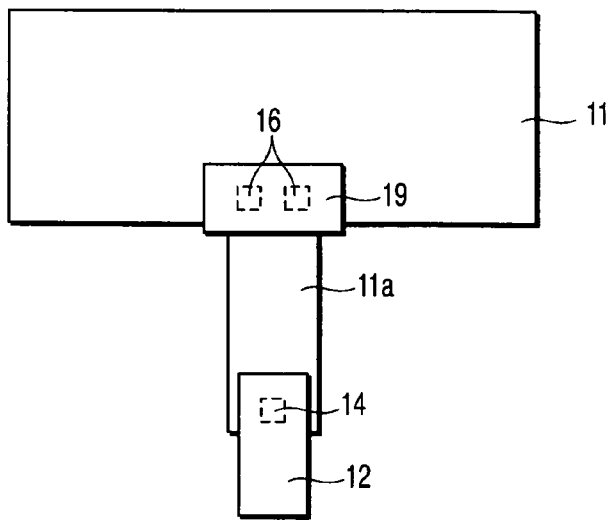
FIG. 5 is a plan view schematically showing wirings at adjacent two different wiring layers, the wiring layers being part of the multi-layered wiring structure of a CMOSLSI according to the third embodiment and the wirings being made of Cu or a Cu alloy.

FIG. 5 is a plan view schematically showing two wirings formed in adjacent two different wiring layers, the wiring layers being part of the multi-layered wiring structure of a CMOSLSI according to the third embodiment and the each wiring being made of Cu or a Cu alloy.

The third embodiment shown in FIG. 5 pertains to the case where a narrow lower wiring 11a (which has a width not more than 2 $\mu$m, for example) is continuous with a wide lower wiring 11 in the same lower wiring layer. In the third embodiment, dummy damaged regions (indicated by 15b in FIG. 2) are formed in the vicinity of the boundary between the wide wiring 11 and the narrow wiring 11a (the dummy damage regions are shown as being closer to the wide wiring 11 in FIG. 5). Dummy vias 16 are formed in contact with the dummy damaged regions, and a dummy upper wiring pattern 19 is connected to the dummy vias 16.

The third embodiment is advantageous in that the number of vias to be formed for connection between the narrow wiring 11a and the upper wiring 12 can be determined without depending upon whether or not the narrow lower wiring 11a is continuous with the wide lower wiring 11 in the same lower wiring layer.

<Fourth Embodiment>

Figure 6:
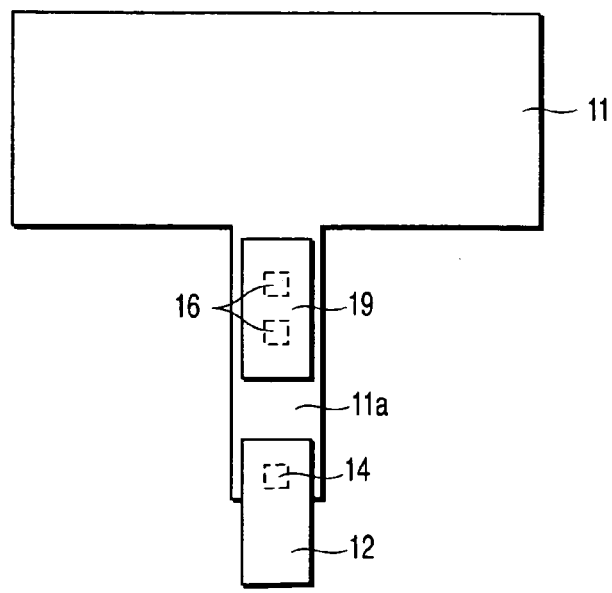
FIG. 6 is a plan view schematically showing wirings at adjacent two different wiring layers, the wiring layers being part of the multi-layered wiring structure of a CMOSLSI according to the fourth embodiment and the wirings being made of Cu or a Cu alloy.

FIG. 6 is a plan view schematically showing wirings formed in adjacent two different wiring layers, the wiring layers being part of the multi-layered wiring structure of a CMOSLSI according to the fourth embodiment and each wiring being made of Cu or a Cu alloy.

The fourth embodiment shown in FIG. 6 pertains to the case where a narrow lower wiring 11a is continuous with a wide lower wiring 11 formed in the same lower wiring layer. In the fourth embodiment, dummy damaged regions (indicated by 15b in FIG. 2) are formed in the region between the wide wiring 11 and that portion of the narrow wiring 11a in which a contact of an interlayer connection via 14 is formed. Dummy vias 16 are formed in contact with the dummy damaged regions, and a dummy upper wiring pattern 19 is connected to the dummy vias 16.

In this embodiment as well, it is possible to attain advantages that are similar to those of the third embodiment.

The present invention is not limited to the embodiments described above, and can be modified without departing from the spirit and scope of the invention. For example, the interlayer insulation film 13 is not limited to $SiO_2$ and may be formed of another kind of material including a so-called low-k material.

As described above, a semiconductor device of the present invention can be fabricated without introducing severe restrictions on how to arrange vias in the metal wirings made of, for example, Cu or a Cu alloy in the multi-layered wiring structure. Accordingly, the wiring of the semiconductor device are improved in reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device containing a multi-layered wiring structure formed on a semiconductor substrate, the structure including at least two wiring layers formed in an interlayer insulation layer, and each of the wiring layers including a metal wiring made of one of Cu and a Cu alloy;
   wherein the multi-layered wiring structure comprises:
   a lower wiring layer formed under the interlayer insulation layer;
   a via buried in the interlayer insulation layer and connected between an upper wiring layer and a first damaged region formed on the lower wiring layer; and
   a dummy via buried in the interlayer insulation layer, the dummy via being not connected to the upper wiring layer but connected to a second damaged region formed on the lower wiring layer,
   wherein voids are generated at the second damaged region in the lower wiring layer of Cu or Cu alloy to cause a contact defect between the dummy via and the lower wiring layer.

2. A semiconductor device according to claim 1, wherein the dummy via is buried in the interlayer insulation layer to be connected between a dummy wiring layer and the lower wiring layer.

3. A semiconductor device according to claim 1, wherein the dummy via includes Cu buried in a via hole formed in the interlayer insulation layer.

4. A semiconductor device according to claim 1, wherein the lower wiring layer includes at least the second damaged region formed at a portion of the lower wiring layer connected to the dummy via buried in the interlayer insulation layer.

5. A semiconductor device according to claim 4, wherein the first damaged region includes a region formed when the via hole is formed through the interlayer insulation layer.

6. A semiconductor device according to claim 4, wherein a plurality of damaged regions connected to a plurality of dummy vias are located at a peripheral part of the lower wiring layer surrounding a contact portion of the lower wiring layer contacting with the via.

7. A semiconductor device according to claim 4, wherein the second damaged region connected to the dummy via is located away from the contact portion connected to the via on the lower wiring layer by a minimum distance defined by a design rule.

8. A semiconductor device according to claim 6, wherein the plurality of damaged regions are formed at portions of the lower wiring layer surrounding three of four sides of a location contacting with a contact portion of the via.

9. A semiconductor device according to claim 4, wherein the dummy via buried in the interlayer insulation layer includes one end contacting with the second damaged region of the lower wiring layer and the other end which is not connected with the upper wiring layer.

10. A semiconductor device according to claim 9, wherein the dummy via contains a structure similar to that of the via.

11. A semiconductor device according to claim 9, wherein the dummy wiring layer connected to the dummy via is formed on the interlayer insulation layer as a dummy wiring pattern which is not connected with the via but is connected with the dummy via.

12. A semiconductor device according to claim 11, wherein the dummy wiring layer and the upper wiring layer are formed in the same wiring layer.

13. A semiconductor device according to claim 1, wherein the lower wiring layer includes a portion having a width greater than that of a remaining thereof and a plurality of vias connected to the lower wiring layer are formed in the interlayer insulation film.

14. A semiconductor device containing a multi-layered wiring structure formed on a semiconductor substrate, the multi-layered wiring structure including at least two wiring layers formed in an interlayer insulation layer, and each of the wiring layers including a metal wiring made of one of Cu and a Cu alloy;
   wherein the multi-layered wiring structure comprises:
   a narrow width lower wiring layer connected with a wide width lower wiring layer having a width wider than that of the narrow width lower wiring layer, the narrow width lower wiring layer and the wide width lower wiring layer being formed in a wiring layer formed in the interlayer insulation layer;
   a via buried in the interlayer insulation layer to connect a first damaged region formed on the narrow width lower wiring layer with an upper wiring layer; and
   a dummy via buried in the interlayer insulation layer, the dummy via being not connected to the upper wiring layer but connected to a second damaged region formed on the wide width lower wiring layer,
   wherein voids are generated at the second damaged region in the wide width lower wiring layer of Cu or Cu alloy to cause a contact defect between the dummy via and the wide width lower wiring layer.

15. A semiconductor device according to claim 14, wherein the dummy via is formed in the interlayer insulation layer at a location corresponding to the second damaged region formed in a vacant region between the narrow width lower wiring layer and the wide width lower wiring layer.

16. A semiconductor device according to claim 15, wherein a dummy via contacting with the second damaged region is buried in the interlayer insulation layer.

17. A semiconductor device according to claim 14, wherein the dummy via includes a structure similar to that of the via.

18. A semiconductor device according to claim 14, wherein a dummy wiring connected to the dummy via is formed on the interlayer insulation layer as a dummy wiring pattern which is not connected with the via.

19. A semiconductor device according to claim 18, wherein the dummy wiring layer and the upper wiring layer are formed in the same wiring layer.

20. A semiconductor device comprising:
a lower wiring layer formed on a semiconductor substrate using Cu or a Cu alloy;
an interlayer insulation layer formed on the lower wiring layer;
an upper wiring layer formed on the interlayer insulation layer;
a via buried in a via hole formed in the interlayer insulation layer to be connected between the upper wiring layer and the lower wiring layer which has a first damaged region formed at a portion corresponding to the via hole; and
a dummy via buried in a dummy via hole formed in the interlayer insulation layer in a similar manner as the via hole, the dummy via being not connected with the upper wiring layer but connected with a second damaged region formed in the lower wiring layer,
wherein voids are generated at the second damaged region in the lower wiring layer of Cu or Cu alloy to cause a contact defect between the dummy via and the lower wiring layer.

* * * * *